United States Patent
Chang et al.

(10) Patent No.: US 6,750,127 B1
(45) Date of Patent: Jun. 15, 2004

(54) METHOD FOR FABRICATING A SEMICONDUCTOR DEVICE USING AMORPHOUS CARBON HAVING IMPROVED ETCH RESISTANCE

(75) Inventors: Mark S. Chang, Los Altos, CA (US); Darin Chan, Campbell, CA (US); Chih Yuh Yang, San Jose, CA (US); Lu You, San Jose, CA (US); Scott A. Bell, San Jose, CA (US); Srikanteswara Dakshina-Murthy, Austin, TX (US); Douglas J. Bonser, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/367,407

(22) Filed: Feb. 14, 2003

(51) Int. Cl.[7] ............ H01L 21/3205; H01L 21/31; H01L 21/469; H01L 21/4763
(52) U.S. Cl. ............ 438/585; 438/766; 438/778
(58) Field of Search ............ 438/585, 766, 438/778; 428/408; 427/526, 577

(56) References Cited

U.S. PATENT DOCUMENTS

| | | | | |
|---|---|---|---|---|
| 4,382,100 A | * | 5/1983 | Holland | 427/577 |
| 5,385,762 A | * | 1/1995 | Prins | 427/526 |
| 5,776,602 A | * | 7/1998 | Ueda et al. | 428/332 |
| 5,837,357 A | * | 11/1998 | Matsuo et al. | 428/212 |
| 5,891,575 A | * | 4/1999 | Marchywka et al. | 428/408 |
| 6,121,158 A | | 9/2000 | Benchikha et al. | |
| 6,171,343 B1 | * | 1/2001 | Dearnaley et al. | 623/23.6 |
| 6,428,894 B1 | * | 8/2002 | Babich et al. | 428/408 |

OTHER PUBLICATIONS

Yamaguchi, A. et al., "Ar Ion implantation into Resist For Etching Resistance Improvement", Proceedings of SPIE vol. 4345 (2001), pp. 655–664.

Borzenko, V. et al., "The Effect of Ion Implantation On Polymer Mask Resistance To Ion Beam Etching", Vacuum, 38, 1007 (1988), pp. 1007–1009.

* cited by examiner

Primary Examiner—John F. Niebling
Assistant Examiner—Ron Pompey
(74) Attorney, Agent, or Firm—Foley & Lardner LLP

(57) ABSTRACT

An amorphous carbon layer is implanted with one or more dopants that enhance the etch resistivity of the amorphous carbon to etchants such as chlorine and HBr that are typically used to etch polysilicon. Such a layer may be pattern to form a handmask for etching polysilicon that provides improved pattern transfer accuracy compared to conventional undoped amorphous carbon.

9 Claims, 8 Drawing Sheets

METHOD FOR FABRICATING A SEMICONDUCTOR DEVICE USING AMORPHOUS CARBON HAVING IMPROVED ETCH RESISTANCE

BACKGROUND OF THE INVENTION

1. Field of the Invention

The invention pertains to fabrication of semiconductor devices, and in particular to fabrication techniques using an amorphous carbon hardmask for etching polysilicon.

2. Related Technology

An emphasis on increased semiconductor device performance has led to investigation of ways to increase device speed. One way of increasing device speed is to reduce the size of individual circuit components and the wiring that connects them. This enables circuit components to operate faster and to be placed closer together, and enables more circuit components to be used in a given device.

One obstacle to reduction of device sizes is the minimum feature size that can be produced through projection lithography, which is related to the wavelength of energy used by the projection lithography system. As a result, supplemental techniques have been developed to produce structures with dimensions that are less than the minimum projection lithography feature size. One such technique involves the trimming of mask structures by isotropic etches prior to patterning of underlying layers. FIG. 1 shows an example of a structure to which the trimming technique may be applied. In FIG. 1, a substrate 10 has formed thereon a silicon oxide gate insulating layer 12 and a polysilicon gate conductive layer 14 that are to be patterned to form a gate line and gate insulator. A hardmask layer 16 such as silicon oxynitride is formed over the polysilicon layer 14, and a photoresist mask 18 is formed over the hardmask layer 16. For purposes of this example, it is assumed that the photoresist mask has the minimum width that can be produced by projection lithography. In subsequent processing, the photoresist mask 18 is trimmed through exposure to an isotropic oxygen plasma that consumes part of the photoresist, thus reducing the width of the photoresist mask and structures patterned using the photoresist mask. The hardmask layer 16 is then patterned using the trimmed photoresist mask as an etch mask. The resulting hardmask structure is subjected to another trimming etch to reduce the width of the hardmask structure, and the trimmed hardmask is then used to pattern the underlying polysilicon to form a narrow gate line. Thus the width of the gate line is narrower than the minimum feature size of the projection lithography system used to produce the photoresist mask 18.

To further exploit the trim technique, it has been proposed to use additional layers in the hardmask structure so that further trimming may be performed at each additional layer. One proposed structure is shown in FIG. 2. The structure of FIG. 2 differs from the structure of FIG. 1 in that it includes a layer of amorphous carbon 20 between the polysilicon layer 14 and the silicon oxynitride layer 16. During pattern transfer, a hardmask structure formed in the amorphous carbon layer 20 may be trimmed prior to patterning of the underlying polysilicon layer 14 to achieve further reductions in feature size.

The use of an amorphous carbon layer as the bottom layer of a multi-layer hardmask structure as shown in FIG. 2 is desirable because any amorphous carbon remaining after completion of the polysilicon etch is easily removed by ashing in an isotropic oxygen or hydrogen plasma without damaging the polysilicon or other exposed materials. However, it has proven difficult to achieve accurate pattern transfer with amorphous carbon hardmasks because of the low resistivity of amorphous carbon to the chlorine or HBr chemistry used to etch the polysilicon. This problem is illustrated in FIGS. 3a and 3b. FIG. 3a shows a trimmed amorphous carbon hardmask 22 that overlies a polysilicon layer 14. FIG. 3b shows the structure of FIG. 3a after etching of the polysilicon. It may be seen by comparison of FIG. 3b to FIG. 3a that the polysilicon etch consumes a significant portion of the amorphous carbon hardmask 22, resulting in reduction of its width during the course of the etch and a corresponding tapering of the resulting gate line 24. In some instances, the loss of amorphous carbon may result in a gate line that is too thin, causing a pattern deformation that can result in loss of pattern control, loss of critical dimension control, and difficulty in controlling polysilicon line thickness. If the amorphous carbon is consumed completely, a reduction in the height of the gate line will result.

SUMMARY OF THE INVENTION

In view of the aforementioned problems of the background technology, there is a need for additional techniques to improve the pattern transfer accuracy of amorphous carbon hardmasks.

In accordance with a preferred embodiment of the invention, an amorphous carbon layer is implanted with one or more dopants that enhance the etch resistivity of the amorphous carbon to etchants such as chlorine and HBr that are typically used to etch polysilicon. Such a layer may be patterned to form a hardmask for etching polysilicon that provides improved pattern transfer accuracy compared to undoped amorphous carbon.

In accordance with one embodiment of the invention, a polysilicon structure is patterned using a doped amorphous carbon hardmask. Initially a substrate is provided. The substrate has a polysilicon layer formed thereon. An amorphous carbon layer is formed on the polysilicon layer. The amorphous carbon layer is then implanted with a dopant that increases the resistance of the amorphous carbon to etching by chemistry used to etch polysilicon. Examples of such dopants are nitrogen, argon, boron and arsenic. An amorphous carbon hardmask is then formed by patterning the amorphous carbon layer. In a preferred embodiment this is achieved through the use of an overlying hardmask layer that is patterned to form a hardmask for etching the amorphous carbon. However, one or more additional layers may be employed, and photoresists masks and hardmasks may be trimmed before etching of underlying layers. The polysilicon layer is then patterned using the amorphous carbon hardmask as an etch mask. Further processing may then be performed, such as ashing of the amorphous carbon hardmask, etching of a gate insulating layer to form a gate insulator, formation of source and drain diffusions, or formation of source and drain contacts.

DESCRIPTION OF PREFERRED EMBODIMENTS

Figure 1:
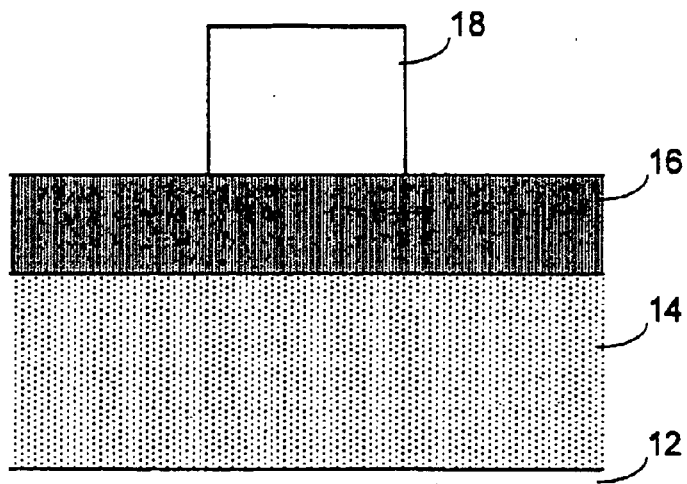
FIG. 1 shows a conventional structure including a hardmask layer.
Figure 2:
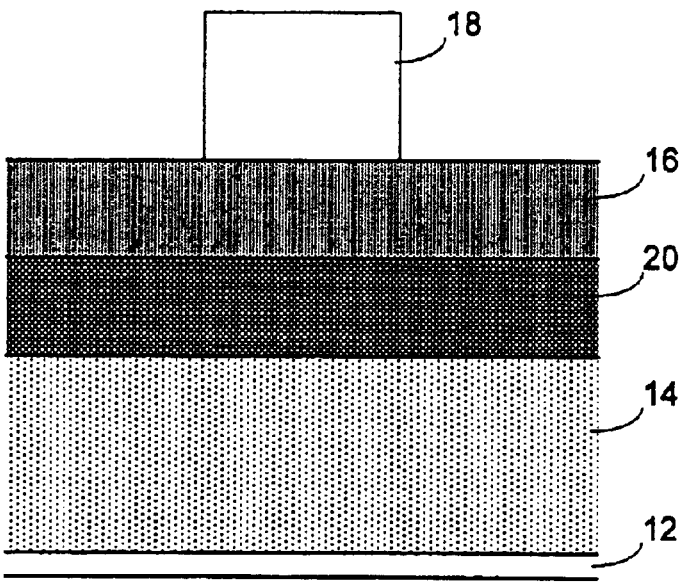
FIG. 2 shows a structure including a multi-layer hardmask structure.
Figure 3A:
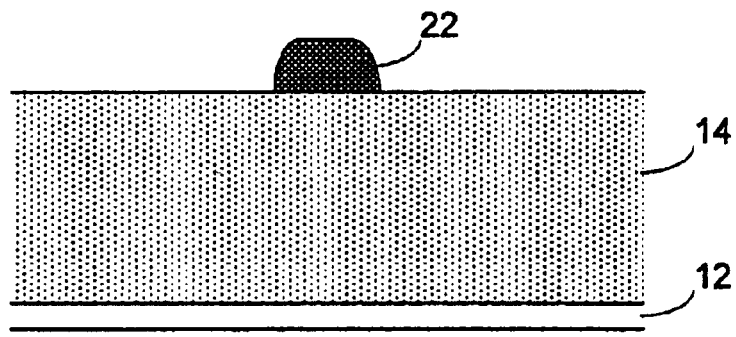
FIGS. 3a and 3b shows structures formed during processing using an amorphous carbon hardmask.
Figure 3B:
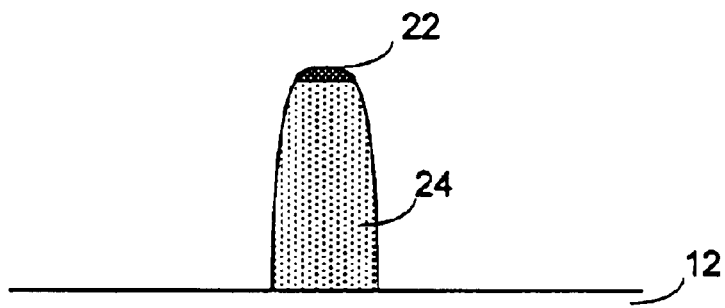
Figure 4A:
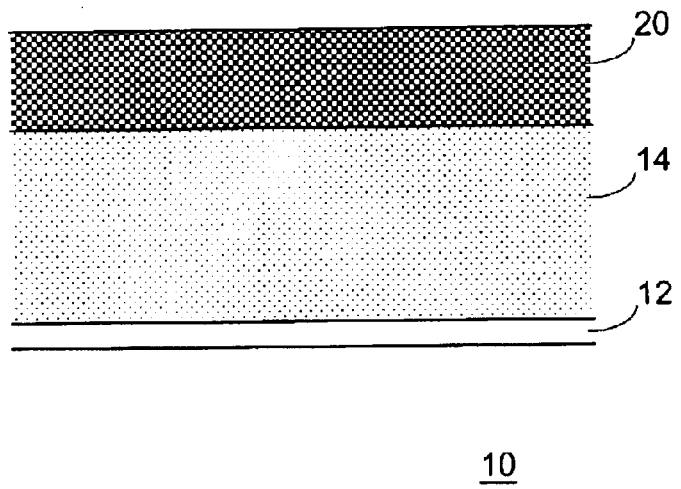
FIGS. 4a, 4b, 4c, 4d, 4e, 4f, 4g, 4h and 4i show structures formed during processing in accordance with a preferred embodiment.

FIGS. 4a–4i show structures formed during processing in accordance with a preferred embodiment of the invention to pattern a gate line from a polysilicon layer. FIG. 4a shows a structure including a semiconductor substrate 10, a gate insulating layer 12, a polysilicon layer 14, and an amorphous carbon layer 20.

Figure 4B:
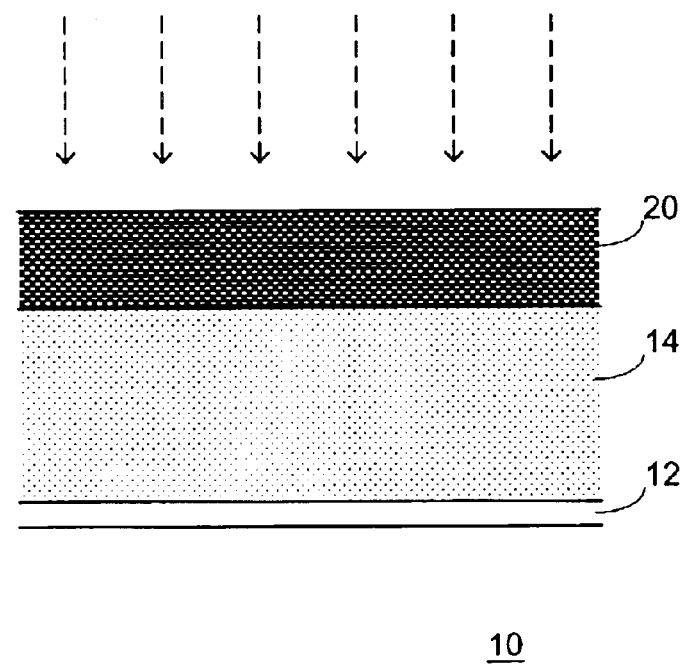

As shown in FIG. 4b, the amorphous carbon layer 20 is implanted with a dopant that increases the resistance of the amorphous carbon to the chlorine or HBr etch chemistry typically employed to pattern polysilicon. A variety of dopants may be employed depending on the particular implementation. Preferred dopants are nitrogen (N) and argon (Ar), which are preferred because they are relatively chemically inert. Arsenic (As) and boron (B) may also be used as dopants, however these dopants entail greater risks because if they penetrate the amorphous carbon layer they can change the dopant profile of underlying semiconductor materials. The energy of implantation will be determined by the thickness of the amorphous carbon layer but is generally in the range of 150 keV. The implant dose is typically in the range of $1 \times 10^{14}$ to $1 \times 10^{16}/cm^2$, and more preferably approximately $1 \times 10^{15}/cm^2$.

Figure 4C:
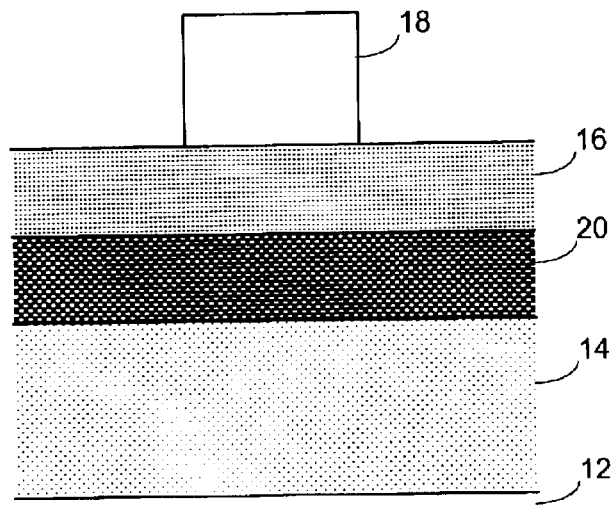

FIG. 4c shows the structure of FIG. 4b after formation of a hardmask layer 16 such as silicon oxynitride on the amorphous carbon layer 20, followed by formation of a photoresist mask 18 on the hardmask layer 16.

Figure 4D:
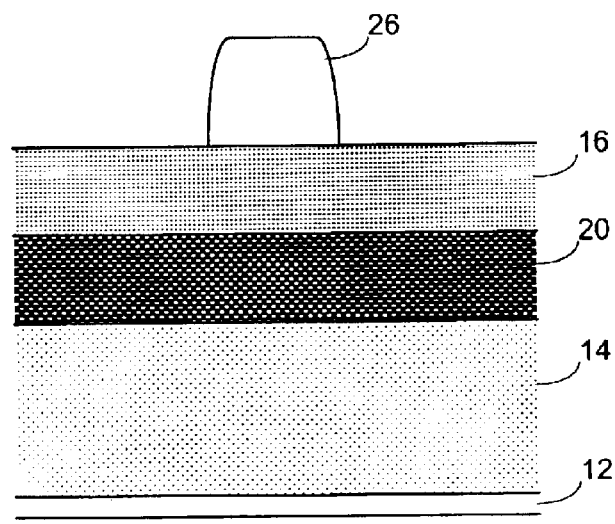

FIG. 4d shows the structure of FIG. 4c after trimming of the photoresist mask to form a trimmed photoresist mask 26. Trimming of the photoresist mask is preferably done using an oxygen, oxygen/chlorine, or oxygen/HBr plasma.

Figure 4E:
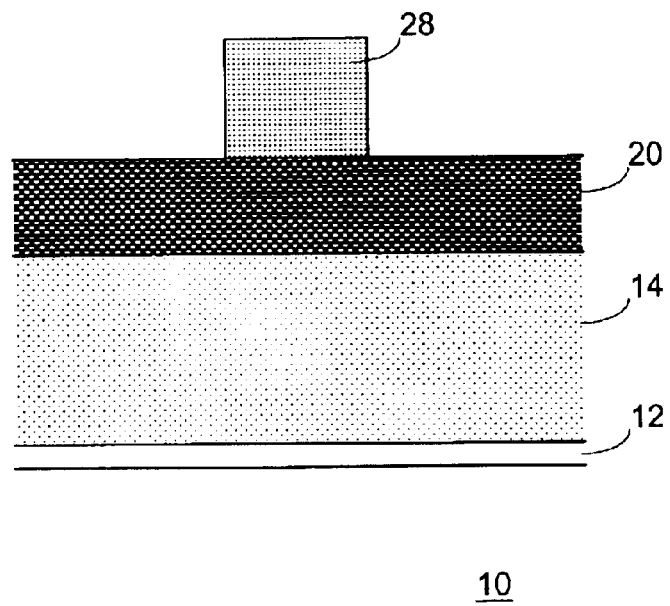

FIG. 4e shows the structure of FIG. 4d after patterning of the hardmask layer 16 using the trimmed photoresist mask as an etch mask to form a hardmask 28. Patterning of the silicon oxynitride hardmask material of the preferred embodiment is preferably performed using a fluorinated chemistry such as $CF_4$.

Figure 4F:
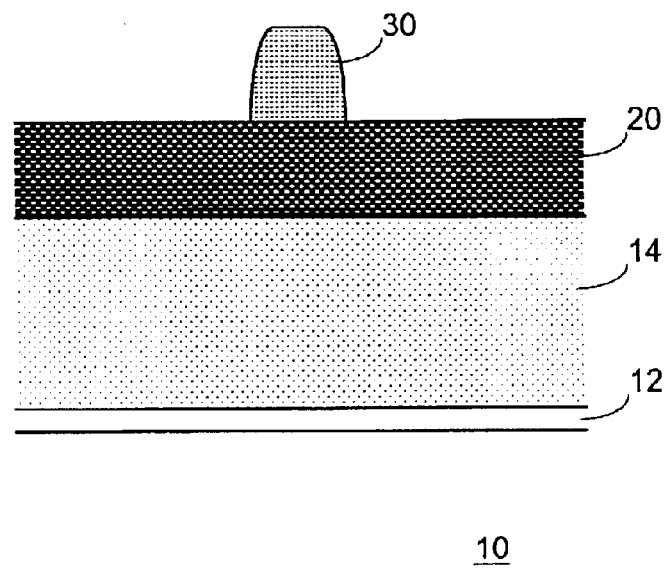

FIG. 4f shows the structure of FIG. 4e after trimming of the hardmask to form a trimmed hardmask 30. Trimming of the silicon oxynitride hardmask of the preferred embodiment is preferably performed using the chemistry used for patterning the silicon oxynitride layer.

Figure 4G:
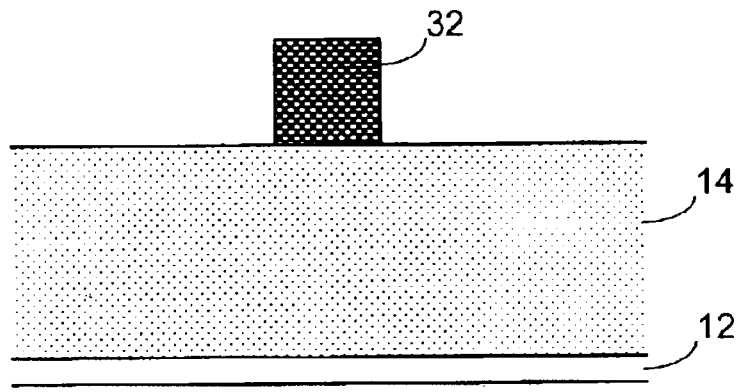
Figure 4H:
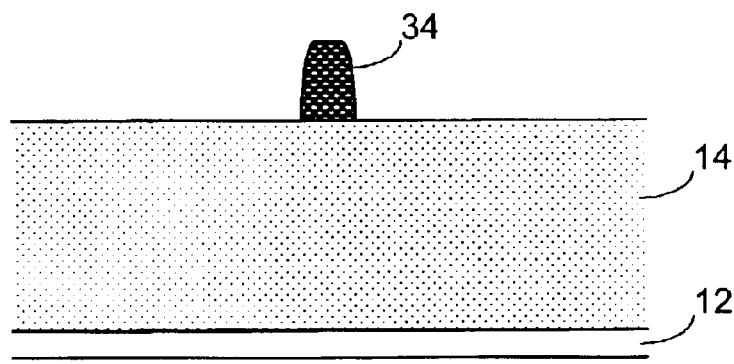

FIG. 4g shows the structure of FIG. 4f after patterning of the amorphous carbon layer 20 using the trimmed hardmask as an etch mask to form an amorphous carbon hardmask 32. Patterning of the amorphous carbon is preferably performed using an oxygen chemistry that contains chlorine or HBr. FIG. 4h shows the structure of FIG. 4g after trimming of the amorphous carbon hardmask to form a trimmed amorphous carbon hardmask 34. Trimming of the amorphous carbon hardmask is preferably performed using the same chemistry used for patterning the amorphous carbon layer.

Figure 4I:
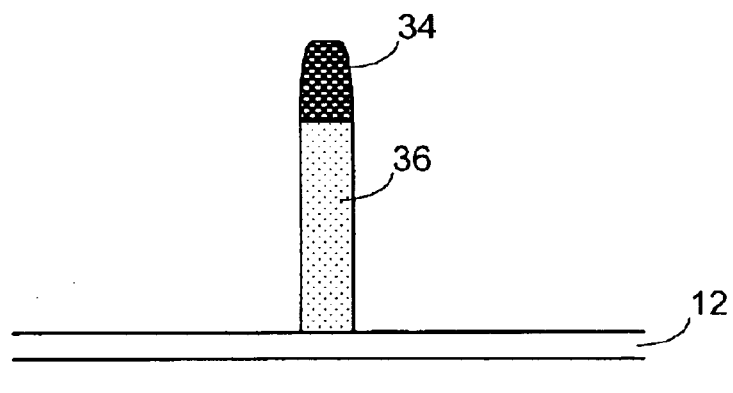

FIG. 4i shows the structure of FIG. 4h after patterning of the polysilicon layer 14 using the trimmed amorphous carbon hardmask 34 as an etch mask to form a gate line 36. Patterning of the polysilicon is preferably performed using a chlorine or HBr chemistry. As seen in FIG. 4i, the amorphous carbon hardmask 34 is relatively unaffected by the polysilicon etch chemistry, resulting in accurate pattern transfer from the amorphous carbon hardmask to the underlying polysilicon.

In further processing, the amorphous carbon hardmask 34 may be removed by an ashing process using an oxygen or hydrogen chemistry.

Additional processing may thereafter be performed, such as formation of source and drain diffusions, formation of gate line spacers, and formation of source and drain contacts.

While the processing shown in FIGS. 4a–4i is presently preferred, a variety of alternatives may be implemented. For example, the process may also be applied to patterning of polysilicon in other contexts, such as patterning of polysilicon wiring rather than polysilicon gate lines. Further, the upper layer of the multi-layer hardmask structure need not be formed of silicon oxynitride, but may be formed of other materials such as silicon nitride or silicon oxide. The choice of materials depends on the available etch chemistries and their selectivities with respect to other exposed materials. Also, the multi-layer hardmask structure need not be a two-layer structure, but rather may include additional layers above the amorphous carbon layer. The trimming of photoresist masks and mask structures patterned at each layer is optional.

With regard to dopants, the aforementioned dopants are preferred, however, alternative dopants may be used. Dopants may be used singly or in combination, depending on the particular implementation.

Figure 5:
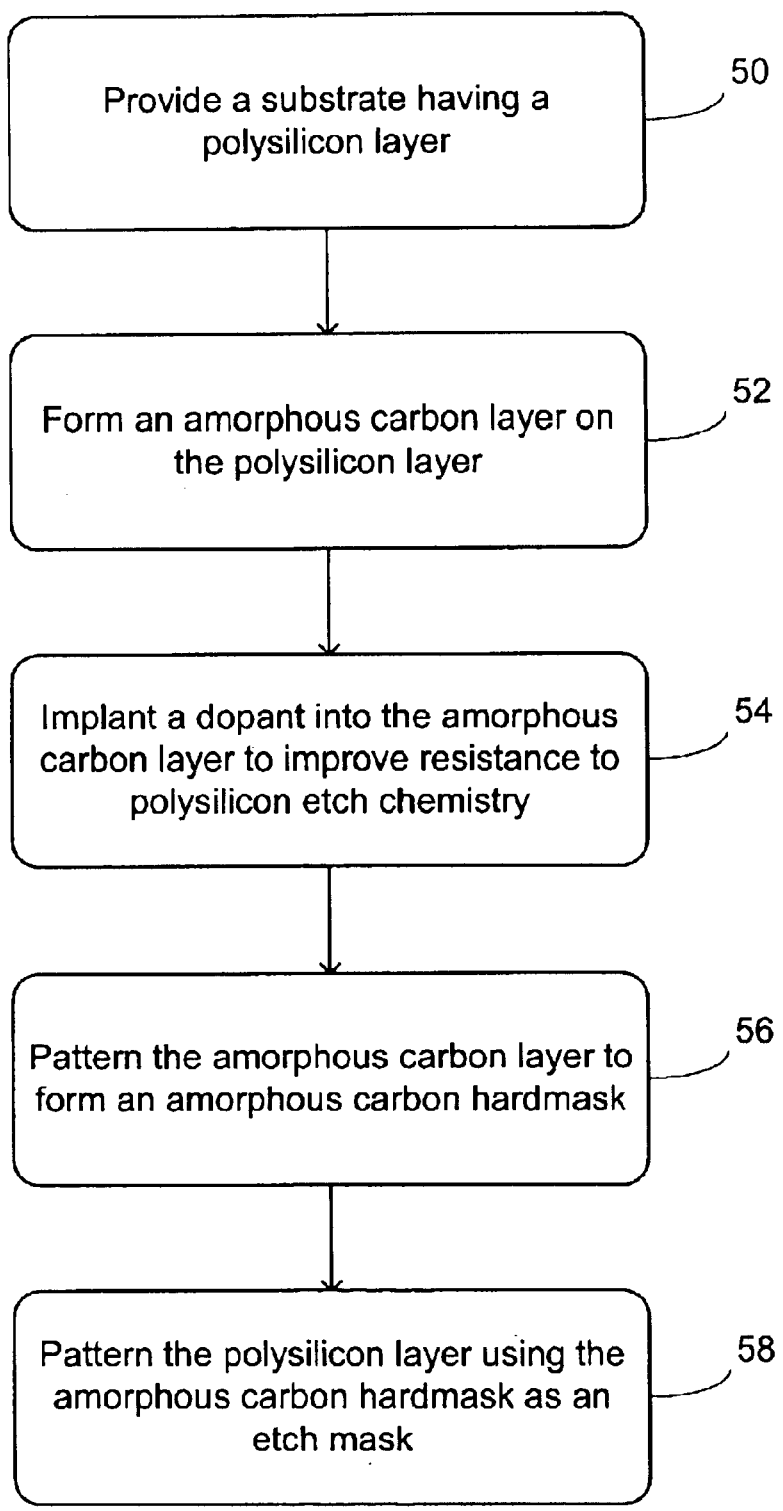
FIG. 5 shows a process flow encompassing the preferred embodiment and alternative embodiments.

FIG. 5 shows a process flow for manufacture of a semiconductor device that encompasses the preferred embodiment, the aforementioned alternatives, and other alternatives. Initially a substrate is provided (50). The substrate has a polysilicon layer formed thereon. An amorphous carbon layer is formed on the polysilicon layer (52). The amorphous carbon layer is then implanted with a dopant that increases the resistance of the amorphous carbon to etching by chemistry used to etch polysilicon (54). Examples of such dopants are nitrogen, argon, boron and arsenic. An amorphous carbon hardmask is then formed by patterning the amorphous carbon layer (56). In the preferred embodiment this is achieved through the use of an overlying hardmask layer that is patterned to form a hardmask for etching the amorphous carbon. However, one or more additional layers may be employed, and photoresists masks and hardmasks may be trimmed before etching of underlying layers. The polysilicon layer is then patterned using the amorphous carbon hardmask as an etch mask (58). Further processing may then be performed, such as ashing of the amorphous carbon hardmask, formation of source and drain diffusions, or formation of source and drain contacts.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A process performed during manufacture of a semiconductor device, comprising:
   providing a substrate having a polysilicon layer formed thereon;
   forming an amorphous carbon layer on the polysilicon layer;
   implanting a dopant into the amorphous carbon layer, the dopant increasing a resistance of the amorphous carbon to etching chemistry used to etch polysilicon;
   forming an amorphous carbon hardmask by patterning the amorphous carbon layer; and
   patterning the polysilicon layer using said etching chemistry and using the amorphous carbon hardmask as an etch mask.

2. The method claimed in claim 1, wherein the substrate further comprises a gate insulating layer formed beneath the polysilicon layer,
   wherein the polysilicon layer is patterned to form a gate line, and
   wherein the process further comprises patterning the gate insulating layer to form a gate insulator.

3. The method claimed in claim 2, further comprising forming source and drain diffusions adjacent to the gate insulator.

4. The method claimed in claim 1, wherein the dopant comprises at least one of nitrogen, argon, boron and arsenic.

5. The method claimed in claim 1, wherein forming the amorphous carbon hardmask is preceded by:
   forming a layer of a hardmask material over the amorphous carbon layer;
   forming a photoresist mask over the layer of hardmask material; and
   forming a hardmask over the layer of amorphous carbon by patterning the layer of hardmask material using the photoresist mask as an etch mask, and
   wherein the amorphous carbon hardmask is patterned using the hardmask as an etch mask.

6. The method claimed in claim 5, wherein forming a hardmask is preceded by trimming the photoresist mask.

7. The method claimed in claim 5, wherein forming the amorphous carbon hardmask is preceded by trimming the hardmask formed over the amorphous carbon layer.

8. A structure formed during fabrication of a patterned polysilicon feature of a semiconductor device, comprising:
   a polysilicon layer; and
   an amorphous carbon hardmask layer formed on the polysilicon, layer, the amorphous carbon being implanted with at least argon to thereby exhibit improved resistance to polysilicon etchants.

9. A structure formed during fabrication of a patterned polysilicon feature of a semiconductor device, comprising:
   a polysilicon layer; and
   an amorphous carbon hardmask layer formed on the polysilicon layer, the amorphous carbon being implanted with at least one of boron and arsenic to thereby exhibit improved resistance to polysilicon etchants.

* * * * *